(12) United States Patent
Gomm

(10) Patent No.: US 7,791,388 B2
(45) Date of Patent: Sep. 7, 2010

(54) DUTY CYCLE ERROR CALCULATION CIRCUIT FOR A CLOCK GENERATOR HAVING A DELAY LOCKED LOOP AND DUTY CYCLE CORRECTION CIRCUIT

(75) Inventor: Tyler Gomm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/203,700

(22) Filed: Sep. 3, 2008

(65) Prior Publication Data

US 2008/0315930 A1 Dec. 25, 2008

Related U.S. Application Data

(63) Continuation of application No. 11/341,062, filed on Jan. 27, 2006, now Pat. No. 7,423,465.

(51) Int. Cl.
*H03K 3/17* (2006.01)
(52) U.S. Cl. .................................................. 327/175
(58) Field of Classification Search ................ None
See application file for complete search history.

(56) References Cited

U.S. PATENT DOCUMENTS

| | | | |
|---|---|---|---|
| 4,527,075 A | 7/1985 | Zbinden | 307/265 |
| 4,780,894 A | 10/1988 | Watkins et al. | 377/34 |
| 5,170,416 A | 12/1992 | Goetz et al. | 377/17 |
| 5,572,158 A | 11/1996 | Lee et al. | 327/175 |
| 5,614,855 A | 3/1997 | Lee et al. | 327/158 |
| 5,673,389 A | 9/1997 | Weber et al. | 395/185.08 |
| 5,727,037 A | 3/1998 | Maneatis | 375/376 |
| 5,757,218 A | 5/1998 | Blum | 327/175 |
| 5,781,055 A | 7/1998 | Bhagwan | 327/270 |
| 5,784,627 A | 7/1998 | MacDonald | 395/750.01 |
| 5,798,885 A | 8/1998 | Saiki et al. | 360/77.08 |
| 5,828,250 A | 10/1998 | Konno | 327/116 |
| 5,945,857 A | 8/1999 | Havens | 327/175 |
| 6,040,726 A | 3/2000 | Martin | 327/175 |
| 6,052,073 A | 4/2000 | Carr et al. | 341/100 |
| 6,052,152 A | 4/2000 | Malcolm, Jr. et al. | 348/537 |
| 6,084,452 A | 7/2000 | Drost et al. | 327/175 |
| 6,125,157 A | 9/2000 | Donnelly et al. | 375/371 |
| 6,137,328 A | 10/2000 | Sung | 327/158 |
| 6,169,434 B1 | 1/2001 | Portmann | 327/175 |
| 6,181,178 B1 | 1/2001 | Choi | 327/175 |
| 6,194,916 B1 | 2/2001 | Nishimura et al. | 327/12 |
| 6,198,326 B1 | 3/2001 | Choi et al. | 327/263 |
| 6,201,423 B1 | 3/2001 | Taguchi et al. | 327/141 |
| 6,275,555 B1 | 8/2001 | Song | 375/375 |
| 6,282,253 B1 | 8/2001 | Fahrenbruch | 375/371 |
| 6,285,226 B1 | 9/2001 | Nguyen | 327/175 |
| 6,294,938 B1 * | 9/2001 | Coddington et al. | 327/158 |
| 6,298,004 B1 | 10/2001 | Kawasaki et al. | 365/233 |
| 6,310,653 B1 | 10/2001 | Malcolm, Jr. et al. | 348/537 |
| 6,320,438 B1 | 11/2001 | Arcus | 327/175 |

(Continued)

*Primary Examiner*—Lincoln Donovan
*Assistant Examiner*—Khareem E Almo
(74) *Attorney, Agent, or Firm*—Dorsey & Whitney LLP

(57) ABSTRACT

A system and method for generating a correction signal for correcting duty cycle error of a first clock signal relative to a second complementary clock signal. Changes to a time difference between high- and low-portions of the first clock signal are detected and the correction signal is generated in response to and accordance with the detected changes.

14 Claims, 11 Drawing Sheets

U.S. PATENT DOCUMENTS

| | | | | |
|---|---|---|---|---|
| 6,342,801 | B1 | 1/2002 | Shin | 327/175 |
| 6,384,652 | B1 | 5/2002 | Shu | 327/175 |
| 6,426,660 | B1 | 7/2002 | Ho et al. | 327/175 |
| 6,433,597 | B2 | 8/2002 | Jung | 327/158 |
| 6,441,659 | B1 | 8/2002 | Demone | 327/156 |
| 6,441,662 | B2 * | 8/2002 | Ikeda | 327/160 |
| 6,445,228 | B1 | 9/2002 | Nguyen | 327/115 |
| 6,452,432 | B2 | 9/2002 | Kim | 327/158 |
| 6,459,314 | B2 | 10/2002 | Kim | 327/161 |
| 6,466,071 | B2 | 10/2002 | Kim et al. | 327/175 |
| 6,496,045 | B1 | 12/2002 | Nguyen | 327/115 |
| 6,498,524 | B1 | 12/2002 | Kawasaki et al. | 327/158 |
| 6,507,220 | B1 | 1/2003 | Groen et al. | 326/93 |
| 6,535,040 | B2 | 3/2003 | Jung et al. | 327/175 |
| 6,539,072 | B1 | 3/2003 | Donnelly et al. | 375/371 |
| 6,542,015 | B2 | 4/2003 | Zhou et al. | 327/172 |
| 6,556,489 | B2 | 4/2003 | Gomm et al. | 365/194 |
| 6,578,154 | B1 | 6/2003 | Wynen et al. | 713/500 |
| 6,580,305 | B1 | 6/2003 | Liu et al. | 327/298 |
| 6,583,657 | B1 | 6/2003 | Eckhardt et al. | 327/175 |
| 6,603,337 | B2 | 8/2003 | Cho | 327/149 |
| 6,605,969 | B2 | 8/2003 | Mikhalev et al. | 327/158 |
| 6,625,765 | B1 | 9/2003 | Krishnan | 714/718 |
| 6,628,276 | B1 | 9/2003 | Elliott | 345/213 |
| 6,643,790 | B1 | 11/2003 | Yu et al. | 713/500 |
| 6,677,792 | B2 | 1/2004 | Kwak | 327/158 |
| 6,690,218 | B2 | 2/2004 | Goldblatt | 327/175 |
| 6,711,226 | B1 | 3/2004 | Williams et al. | 375/371 |
| 6,737,927 | B2 | 5/2004 | Hsieh | 331/74 |
| 6,744,289 | B2 | 6/2004 | Nguyen et al. | 327/115 |
| 6,750,688 | B2 | 6/2004 | Takai | 327/158 |
| 6,765,421 | B2 | 7/2004 | Brox et al. | 327/175 |
| 6,765,976 | B1 | 7/2004 | Oh | 375/376 |
| 6,768,697 | B2 | 7/2004 | Labrum et al. | 365/233 |
| 6,788,120 | B1 | 9/2004 | Nguyen | 327/172 |
| 6,794,913 | B1 | 9/2004 | Stengel | 327/158 |
| 6,801,067 | B2 | 10/2004 | Jang | 327/161 |
| 6,801,072 | B2 | 10/2004 | Guinea et al. | 327/277 |
| 6,819,155 | B1 | 11/2004 | Ling et al. | 327/175 |
| 6,853,225 | B2 | 2/2005 | Lee | 327/158 |
| 6,859,107 | B1 | 2/2005 | Moon et al. | 331/11 |
| 6,873,199 | B2 | 3/2005 | Nishimura et al. | 327/279 |
| 6,876,240 | B2 | 4/2005 | Moon et al. | 327/158 |
| 6,879,923 | B2 | 4/2005 | Butler | 702/104 |
| 6,882,196 | B2 | 4/2005 | Yee et al. | 327/175 |
| 6,917,230 | B2 | 7/2005 | Miller | 327/158 |
| 6,920,081 | B2 | 7/2005 | Labrum et al. | 365/233 |
| 6,924,684 | B1 | 8/2005 | Nguyen | 327/241 |
| 6,927,642 | B2 | 8/2005 | Hsieh | 331/175 |
| 6,934,215 | B2 | 8/2005 | Chung et al. | 365/233 |
| 6,940,328 | B2 | 9/2005 | Lin | 327/175 |
| 6,958,639 | B2 | 10/2005 | Park et al. | 327/175 |
| 6,963,235 | B2 | 11/2005 | Lee | 327/158 |
| 6,982,581 | B2 | 1/2006 | Dosho et al. | 327/175 |
| 7,005,900 | B1 | 2/2006 | Nguyen | 327/122 |
| 7,005,904 | B2 | 2/2006 | Minzoni | 327/175 |
| 7,015,739 | B2 | 3/2006 | Lee et al. | 327/175 |
| 7,019,574 | B2 | 3/2006 | Schrodinger | 327/175 |
| 7,020,228 | B2 | 3/2006 | Miyano | 375/376 |
| 7,039,147 | B2 | 5/2006 | Donnelly et al. | 375/373 |
| 7,046,059 | B2 | 5/2006 | Kwak | 327/158 |
| 7,075,856 | B2 | 7/2006 | Labrum et al. | 365/233 |
| 7,078,949 | B2 | 7/2006 | Kim et al. | 327/158 |
| 7,098,714 | B2 | 8/2006 | Lin | 327/291 |
| 7,116,141 | B2 | 10/2006 | Demone | 327/149 |
| 7,116,143 | B2 | 10/2006 | Deivasigamani et al. | 327/149 |
| 7,116,149 | B2 | 10/2006 | Kim | 327/175 |
| 7,119,594 | B2 | 10/2006 | Kim | 327/175 |
| 7,120,839 | B2 | 10/2006 | Fayneh et al. | 714/700 |
| 7,227,809 | B2 | 6/2007 | Kwak | 365/233 |
| 7,403,056 | B2 | 7/2008 | Qu et al. | 327/269 |
| 2001/0013989 | A1 | 8/2001 | Saiki et al. | 360/78.04 |
| 2003/0080791 | A1 | 5/2003 | Fiscus | 327/158 |
| 2004/0113667 | A1 | 6/2004 | Jin | 327/158 |
| 2005/0028019 | A1 | 2/2005 | Kim | 713/500 |
| 2005/0262373 | A1 | 11/2005 | Kim | 713/401 |
| 2005/0270893 | A1 | 12/2005 | Lin et al. | 365/233 |
| 2006/0044931 | A1 | 3/2006 | Kim | 365/233 |
| 2006/0045227 | A1 | 3/2006 | Guan | 375/376 |
| 2006/0103440 | A1 | 5/2006 | Easwaran | 327/158 |
| 2007/0194821 | A1 | 8/2007 | Gomm et al. | 327/158 |

* cited by examiner

| SH_HIGH | SH_LOW | OUTPUT |
|---|---|---|
| NONE | NONE | NO OUTPUT |
| SHIFT RIGHT | SHIFT RIGHT | |
| SHIFT LEFT | SHIFT LEFT | |
| NONE | SHIFT RIGHT | SH_SUB |
| SHIFT LEFT | SHIFT RIGHT | |
| SHIFT LEFT | NONE | |
| NONE | SHIFT LEFT | SH_ADD |
| SHIFT RIGHT | SHIFT LEFT | |
| SHIFT RIGHT | NONE | |

DUTY CYCLE ERROR CALCULATION CIRCUIT FOR A CLOCK GENERATOR HAVING A DELAY LOCKED LOOP AND DUTY CYCLE CORRECTION CIRCUIT

CROSS-REFERENCE TO RELATED APPLICATION

This application is a continuation of U.S. patent application Ser. No. 11/341,062, filed Jan. 27, 2006 and issued as U.S. Pat. No. 7,423,465 B2 on Sep. 9, 2008. This application and patent are each incorporated by reference herein.

TECHNICAL FIELD

The present invention relates generally to integrated circuits, and more specifically to circuits for generating an internal clock signal having a corrected duty cycle and synchronized to an external clock signal applied to an integrated circuit.

BACKGROUND OF THE INVENTION

In synchronous integrated circuits, the integrated circuit is clocked by an external clock signal and performs operations at predetermined times relative to the rising and falling edges of the applied clock signal. Examples of synchronous integrated circuits include synchronous memory devices such as synchronous dynamic random access memories ("SDRAMs"), synchronous static random access memories ("SSRAMs"), and packetized memories like SLDRAMs and RDRAMs, and include other types of integrated circuits as well, such as microprocessors. The timing of signals external to a synchronous memory device is determined by the external clock signal, and operations within the memory device are typically synchronized to external operations. For example, commands are placed on a command bus of the memory device in synchronism with the external clock signal, and the memory device must latch these commands at the proper times to successfully capture the commands. To latch the applied commands, an internal clock signal is developed in response to the external clock signal, and is typically applied to latches contained in the memory device to clock the commands into the latches. The internal clock signal and external clock must be synchronized to ensure the internal clock signal clocks the latches at the proper times to successfully capture the commands. In the present description, "external" refers to signals and operations outside of the memory device, and "internal" refers to signals and operations within the memory device. Moreover, although the present description is directed to synchronous memory devices, the principles described herein are equally applicable to other types of synchronous integrated circuits.

Internal circuitry in the memory device that generates the internal clock signal necessarily introduces some time delay, causing the internal clock signal to be phase shifted relative to the external clock signal. As long as the phase-shift is minimal, timing within the memory device can be easily synchronized to the external timing. However, with higher frequency clock signals, the time delay introduced by the internal circuitry becomes more significant. This is true because as the frequency of the external clock signal increases, the period of the signal decreases and thus even small delays introduced by the internal circuitry correspond to significant phase shifts between the internal and external clock signals. As a result of inherent delays, the commands applied to the memory device may no longer be valid by the time the internal clock signal clocks the latches. Additionally, as the frequency of the external clock increases, variations in the duty cycle of the clock signal introduce a greater duty cycle error. An ideal duty cycle for a clock signal is typically 50 percent. That is, over the period of a clock cycle, the clock signal is HIGH for 50 percent of the period. As the period of the clock signals become shorter due to the increased clock frequency, a clock variation that results in a subtle shift in duty cycle, and which can be ignored at a lower clock frequency, may result in a much more significant shift in the duty cycle of the higher frequency clock signal. In such instances, if the duty cycle of the clock signal is left uncorrected, timing errors may cause the memory device to fail.

To synchronize external and internal clock signals in modern synchronous memory devices, a number of different approaches have been considered and utilized, including delay locked loops ("DLLs") with duty cycle correction ("DCC") circuits, as will be appreciated by those skilled in the art. To correct duty cycle errors in clock signals, DCC circuits have been used to generate clock signals having a 50 percent duty cycle. As used herein, the term synchronized includes signals that are coincident and signals that have a desired delay relative to one another.

FIG. 1 illustrates a conventional clock generator 100 having a DLL 110 and a DCC circuit 120. An input clock signal CLK represents an external clock signal applied to the DLL 110. As will be explained in more detail below, the DLL 110 generates an output clock signal CLK0 that is synchronized with the CLK signal. Due to the design of conventional DLLs, a duty cycle error in the CLK signal is carried through to the CLK0 signal. Thus, the CLK0 signal is provided to the DCC circuit 120 to correct any duty cycle error and generate an output clock signal CLKSYNC that is synchronized with the CLK0 signal and has a duty cycle corrected to 50 percent.

FIG. 2 illustrates the conventional DLL 110 and the DCC circuit 120 in greater detail. The DLL includes an input buffer 202 that provides a buffered clock signal CLKBUF in response to receiving the CLK signal. The CLKBUF signal is delayed relative to the CLK signal due to a propagation delay of the input buffer 202. The CLKBUF signal is provided to a variable delay circuit 204 that has a variable delay controlled by an adjustment signal DADJ1 generated by a shift register 206. The output clock signal of the variable delay circuit 204 is the CLK0 signal, which is delayed relative to the CLKBUF signal by the variable delay. An output clock signal CLKSYNC is fed back through a model delay 208 to provide a feedback clock signal CLKFB1. The model delay 208 adds a delay to the CLKSYNC signal, which is approximately equal to the total delay of the input buffer 202, an output buffer 240 in the DCC 120, and the delay that is injected by the DCC circuit 120 to the CLK0 signal and a CLK180 signal. A phase detector compares the CLKBUF and CLKFB1 signals, and generates a control signal DCONT1 for the shift register 206 in response to the phase difference between the CLKBUF and CLKFB1 signals. The variable delay circuit 204 is adjusted until the variable delay is sufficient to synchronize the CLKBUF and CLKFB1 signals. When the CLKBUF and CLKFB1 signals are in phase, the DLL 110 is said to be "locked." Under this condition, the timing of the CLK0 signal is such that the delay of the output buffer 240 is accommodated, and a clock signal output by the output buffer 240 would be in phase with the CLK signal. As known in the art, when the CLKBUF and CLKFB1 signals are in phase, the delay of the DLL feedback loop, generally defined by the variable delay 204 and the model delay 208, is a multiple of the period TCLKBUF of the CLKBUF signal. That is, the feedback loop delay is equal to n*TCLKBUF, where "n" is an integer value.

As previously mentioned, the CLK0 signal is provided to the DCC circuit 120 for duty cycle correction. The DCC circuit 120 includes a first variable delay 230 and a second variable delay 232, which are coupled in series. An output clock signal CLKFB2 of the variable delay 232 is compared with the CLK0 signal by a phase detector 238. The phase detector 238 generates a control signal DCONT2 that is provided to a shift register 234. The shift register 234 generates an adjustment signal DADJ2 based on the DCONT2 signal that is used to adjust both the variable delay 230 and the variable delay 232 to the same delay. When the variable delays 230, 232 have been adjusted so that the phase difference between the CLK0 and CLKFB2 signals is an odd multiple of the clock period of the CLK0 signal an output clock signal CLK180 from the first variable delay 230 is 180 degrees out of phase from the CLK0 signal. As known in the art, the delay of the feedback loop for the DCC circuit 120, which is generally defined by the variable delays 230 and 232, is equal to one period of the CLK0 signal. Thus, one-half the loop delay, that is, the delay of one of the variable delays 230 or 232, will provide a delay equal to one-half the period of the CLK0 signal, which is a clock signal 180 degrees out of phase from the CLK0 signal. The CLK0 and CLK180 signals are used by the output buffer 240 to generate the CLKSYNC signal, which is synchronized with the CLK signal and has a corrected duty cycle.

The conventional clock generator 100 places the DLL 110 and DCC circuit 120 in series with each other. This arrangement requires a clock signal to propagate through a plurality of adjustable delay lines, each of which have an adjustable delay that is potentially affected by such factors as the consumption of power or space, and by the operating limitations of the circuit.

Although the conventional clock generator 100 can successfully generate a synchronized clock signal having a 50% duty cycle, the conventional arrangement of the DLL 110 and the DCC circuit 120 is susceptible to several issues. One issue is clock jitter. Clock jitter is exhibited as small variations in the phase of the output clock signal that is generated by the clock generator 100. Clock jitter can be caused by small fluctuations or variations in the delay times of the delay stages found in adjustable delay lines, such as in the DLL 110 and the DCC circuit 120. As the delay times of the delay stages fluctuate, the resulting clock signal will drift or "jitter." The fluctuations in delay time can be caused by power supply noise, which affects the delay time of each active delay stages of an adjustable delay line. In a conventional arrangement of the DLL 110 and the DCC circuit 120, such as that shown in FIGS. 1 and 2, having multiple adjustable delay lines (such as adjustable delay lines 204, 230, 232) coupled in series can compound a clock jitter problem. That is, a clock signal output by a first adjustable delay line will have clock jitter, and is propagated through a second adjustable delay line, which also injects jitter. The resulting clock signal output by the second adjustable delay line will have a cumulative clock jitter from both the first and second delay lines. Propagating the clock signal through one more adjustable delay line will only result in generating a clock signal having yet more clock jitter.

Moreover, the cascaded structure of variable delays results in relatively high power consumption, in addition to the problems with jitter as previously described, that can be compounded by the power supply noise potentially occurring at each stage of the delay, making an undesirable situation even worse.

Other issues with the arrangement of the DLL 110 and the DCC circuit 120 of the clock generator 100 are slowness of operation and cumbersome size. The conventional clock generator 100 is slow because two different feedback loops must be locked in sequence before an acceptable CLKSYNC signal is generated. That is, in one arrangement, upon start up, the DCC 120 is synchronized before the DLL 110 is activated to provide a clock signal having the appropriate delay relative to the CLK signal. Alternatively, the DLL 110 is locked to generate a synchronized clock signal before the DCC 120 is activated for duty cycle correction. It may take the DLL 110 by itself several hundred clock cycles to obtain lock and generate a synchronized CLK0 signal. The DCC circuit 120 then takes additional time to adjust the variable delays 230 and 234 to synchronize the CLK0 signal and the CLKFB signal to provide a suitable CLK180 signal. The time for the DCC circuit 120 to lock can add a significant amount of time to the already lengthy time it takes to lock the DLL 110.

The clock generator 100 is cumbersome because the circuit includes nearly two complete DLLs. That is, a clock signal must propagate through three different variable delay circuits 204, 230, 232 of similar delay length, two phase detectors 210, 238, and two shift registers 206, 234. A variable delay typically takes up a relatively large amount of space on a semiconductor substrate on which the clock generator and other components of a memory device are formed. Having multiple variable delays of similar delay length only exacerbates the issue and can be undesirable where the general design goal is reducing circuit size.

Therefore, there is a need for an alternative clock generator that combines the functions of a DLL 110 and DCC circuit 120 that reduces the size of the circuit, supply-induced noise and operating limitations, while improving circuit performance and clock jitter performance.

SUMMARY OF THE INVENTION

One aspect of the invention provides a duty cycle correction circuit for generating a correction signal for changing a phase relationship of first and second complementary clock signals to provide duty cycle corrected clock signals. The duty cycle correction circuit includes a first circuit operable to generate a first signal indicative of a time period of a high-cycle of the first clock signal and further includes a second circuit operable to generate a second signal indicative of a time period of a low-cycle of the first clock signal. An error calculation circuit coupled to the first and second circuits is operable to monitor the first and second signals and further operable to generate the correction signal in response to the first and second signals.

Another aspect of the invention provides a duty cycle correction circuit having a measuring circuit and a duty cycle error calculation circuit. The measuring circuit is operable to generate signals indicative of a time difference between a high-portion and a low portion of a clock signal. The duty cycle error calculation circuit is coupled to the measuring circuit and is operable to generate a control signal responsive to changes in the time difference between the high- and low-portions of the clock signal as represented by the signals generated by the measuring circuit. The control signal is indicative of a phase correction between the clock signal and a complementary clock signal due to the changes in the time difference between the high- and low-portions of the clock signal.

Another aspect of the invention provides a method for generating a correction signal for correcting duty cycle error of a first clock signal relative to a second complementary clock signal. The method includes detecting changes to a time difference between high- and low-portions of the first clock signal and generating the correction signal in response to and accordance with the detected changes.

Another aspect of the invention provides a method for generating a delay control signal to adjust a delay circuit for maintaining a phase relationship between a first clock signal and a second complementary clock signal. The method includes generating the delay control signal responsive to changes to a time difference between first and second portions of the first clock signal. The delay control signal is indicative of a delay adjustment due to the changes in the time difference to maintain the phase relationship between the first clock signal and the second complementary clock signal.

DETAILED DESCRIPTION OF PREFERRED EMBODIMENTS

In the following description, certain details are set forth below to provide a sufficient understanding of the invention. However, it will be clear to one skilled in the art that the invention may be practiced without these particular details. In other instances, well-known circuits, control signals, timing protocols, and software operations have not been shown in detail or omitted entirely in order to avoid unnecessarily obscuring the invention.

Figure 3:
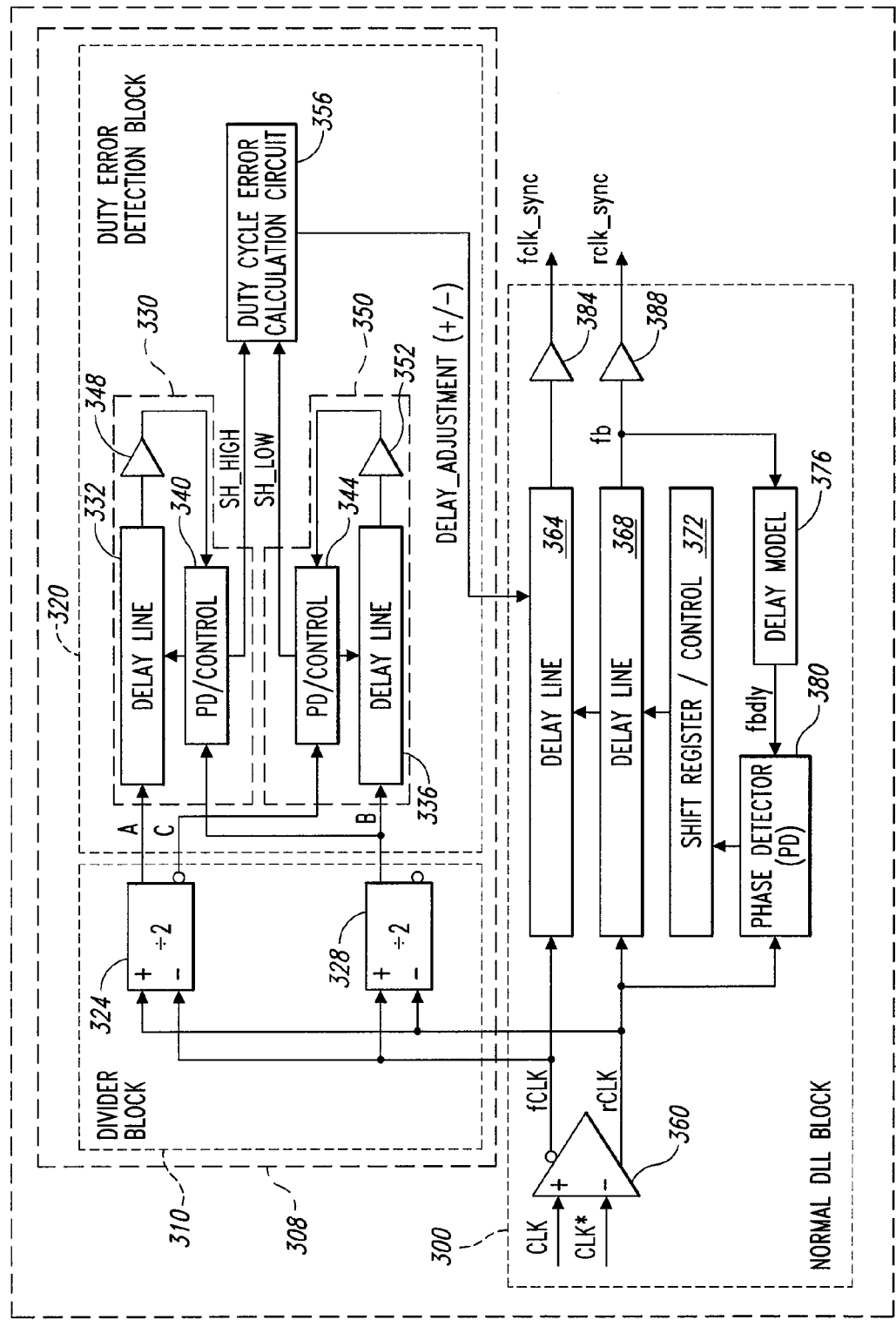
FIG. 3 is a functional block diagram of a clock generator having a duty cycle error calculation circuit according to an embodiment of the invention.
Figure 4:
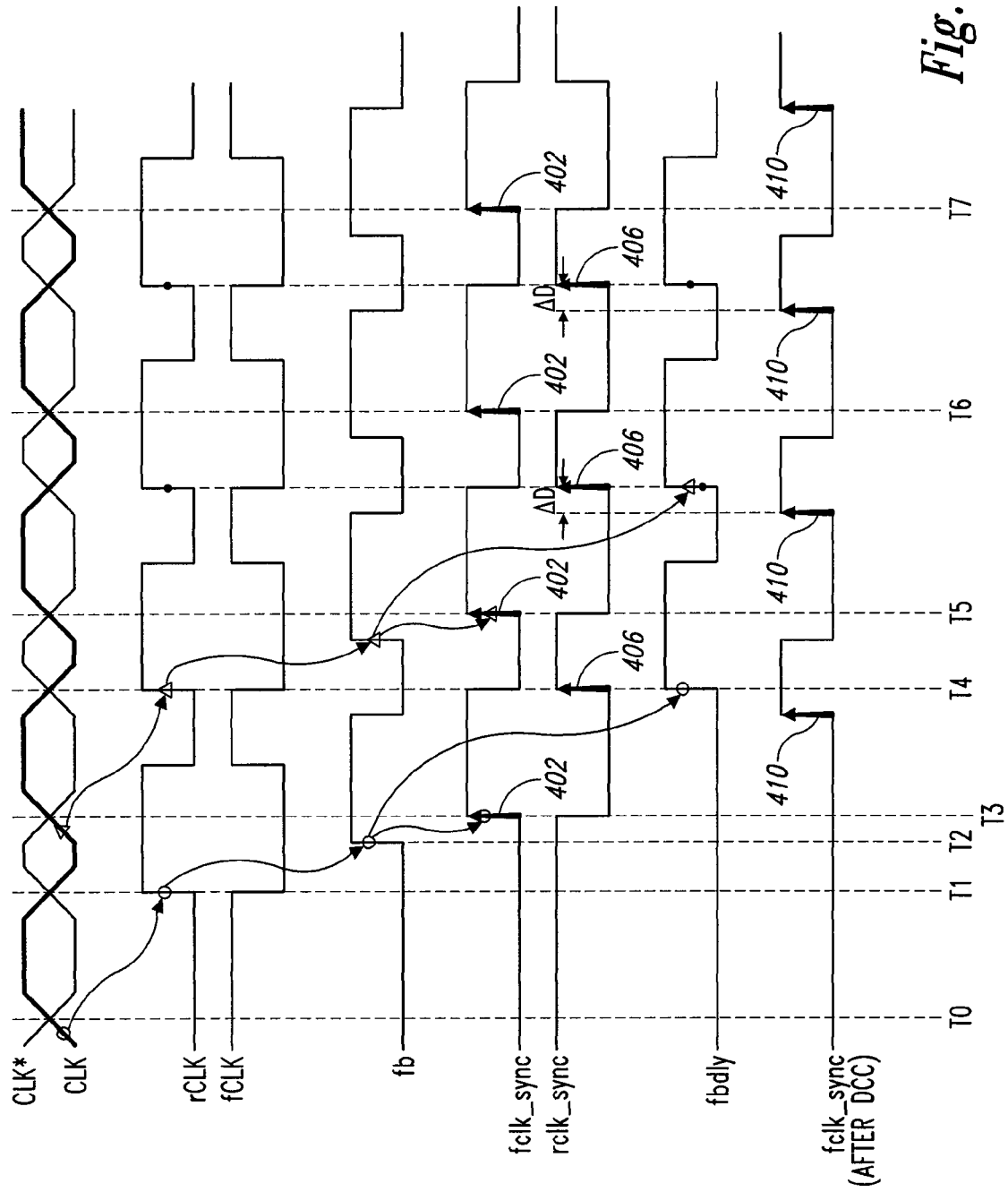
FIG. 4 is a timing diagram of various signals during operation of the clock generator of FIG. 3 according to an embodiment of the invention.

FIG. 3 illustrates a clock generator 302 having a duty cycle error calculation circuit according to an embodiment of the present invention. The clock generator 302 includes a DLL 300 and a DCC circuit 308. The DCC circuit 308 includes a divider block 310 and a duty error detection block 320. The DLL 300 functions in the same manner as described previously for the conventional DLL 120, but is further described in detail as it relates to operation of the clock generator 302. The DLL 300 includes an input buffer 360 that receives input clock signals CLK and CLK*. The CLK and CLK* signals are complementary clock signals and are shown in FIG. 4 as having a distorted duty cycle. Buffered clock signals rCLK and fCLK are generated by the input buffer 360 in response to the CLK and CLK* signals, respectively. The rCLK and fCLK signals are delayed relative to the CLK and CLK* signals by the propagation delay of the input buffer 360, which is shown in FIG. 4 as the delay between time T0 and T1.

As also shown in FIG. 4, the duty cycle error of the CLK and CLK* signals is also propagated by the input buffer 360 to the rCLK and fCLK signals.

The DLL 300 includes two delay lines that each corresponds to one of the buffered input signals rCLK and fCLK. The rCLK signal is provided to the adjustable delay 368 to generate a feedback signal fb that is delayed relative to the rCLK signal by an adjustable delay of the adjustable delay line 368. The delay is shown in FIG. 4 as delay between time T1 and T2. The fb signal is further delayed through a model delay 376 to provide a delayed feedback signal fbdly to the phase detector 380. The delay of the model delay 376 is shown in FIG. 4 as the delay between times T2 and T4. The delay of the model delay 376 is approximately equal to the total propagation delay of the input buffer 360 and the output buffer 388, 384. The phase detector 380 determines the phase difference between the rCLK signal and the fbdly signal and generates a control signal indicative of the phase difference that is provided to the shift register/control circuit 372. The adjustable delay line 368 is adjusted by the shift register/control circuit 372 until the rCLK and fbdly signals are in phase. FIG. 4 illustrates the case when the delay of the adjustable delay line 368 has already been adjusted accordingly, as shown by the alignment of the rising clock edges of the rCLK signal and the fbdly signal at time T4. When this occurs, the DLL 300 is described as obtaining a "locked" state, and the total delay of the fb signal relative to the CLK signal is such that an output clock signal rclk_sync, which is delayed relative to the fb signal by the propagation delay of the output buffer 388 (shown in FIG. 4 as the delay between times T2 and T3), is in phase, or synchronized, with the CLK signal. The rclk_sync signal is shown in FIG. 4 when the DLL 300 is locked, as illustrated by the alignment of the rising edges of the rclk_sync signal with the crossing of the rising edge of the CLK signal and the falling edge of the CLK* signal at times T3, T5, and T6.

The adjustable delay line 364, which provides a delay to the fCLK signal, is adjusted by the shift register/control circuit 372 to have the same delay as the adjustable delay line 368. As a result, the output clock signal fclk_sync is delayed relative to the fCLK signal by the same amount as the rclk_sync signal is delayed relative to the rCLK signal. Thus, as shown in FIG. 4, the output clock signal fclk_sync is also synchronized with the CLK* signal and the complementary relationship between the rCLK and fCLK signals is maintained by the rclk_sync and fclk_sync signals.

Although the rclk_sync and fclk_sync signals are synchronized with the CLK and CLK* signals, the duty cycle of the rclk_sync and fclk_sync signals continues to have distorted duty cycles. As will be explained in more detail below, the DCC circuit 308 adjusts the delay of the adjustable delay line 364 to provide duty cycle corrected complementary clock signals. That is, although the respective duty cycles of the rclk_sync and fclk_sync signals remain uncorrected, duty cycle error correction is provided by changing the timing of one of the output clock signals relative to the other output clock signal to provide rising clock edges of the output clock signals corresponding to clock edges of a clock signal having a 50% duty cycle.

With reference to FIG. 4, arrows 402 correspond to the rising edges of the rclk_sync signal, which as previously discussed, is synchronized with the CLK signal. Arrows 406 correspond to the rising edges of the fclk_sync signal, which is synchronized with the CLK* signal. As shown in FIG. 4, the rising edges of the uncorrected fclk_sync signal do not occur half-way between the rising edges of the rclk_sync signal, as would be the case where the rclk_sync and fclk_sync signals have 50% duty cycles. However, by adjusting the delay of the adjustable delay line 364, the fclk_sync signal can be shifted relative to the rclk_sync signal to provide rising edges that model a 50% duty cycle. A corrected fclk_sync signal is shown in FIG. 4 as fclk_sync (after DCC). Due to an adjustment ΔD made by the DCC circuit 308 to the adjustable delay line 364, the fclk_sync (after DCC) signal has rising edges, represented by arrows 410, that occur halfway between the rising edges of the rclk_sync signal (corresponding to times T5, T6, T7), as for the case where the rclk_sync and fclk_sync signals actually have a 50% duty cycle.

An embodiment of the duty error correction mechanism for this invention consists of a divider block 310 and duty error detection block 320. The divider block 310 includes frequency divider circuits 324, 328 for generating three clock signals A, B, and C, each having one-half the clock frequency of the rCLK and fCLK signals. The rCLK and fCLK signals are provided to each of the divider circuits 324, 328. The divider circuit 324 receives the rCLK signal at a rising edge input (designated by a "+" symbol) and receives the fCLK signal at a falling edge input (designated by a "−" symbol). The divider circuit 324 generates the clock signal A by making a clock transition in the clock signal A in response to a rising edge of the rCLK signal crossing a falling edge of the fCLK signal. The divider circuit 324 further generates the clock signal C, where the signal C is inverse of the signal A. Similarly, the divider circuit 328 generates the clock signal B by providing a clock transition in the clock signal B in response to a rising edge of the fCLK signal crossing a falling edge of the rCLK signal.

The duty error detection block 320 then receives the clock signals A, B, and C from the divider block 310. The duty error detection block includes two measuring circuits 330, 350 each having a respective adjustable delay line 332, 336. The delay line 332 of the measuring circuit 330 receives and delays the signal A, which is then sent to a phase detector 340. The phase detector 340 receives the signal B and the delayed signal A and generates a SH_HIGH signal representing the phase difference of the two signals. Similarly, the delay line 336 of the measuring circuit 350 receives and delays the signal B, which is then sent to a phase detector 344. The phase detector 344 receives the delayed signal B and the signal C and generates a SH_LOW signal representing the phase difference of the two signals. The SH_HIGH and SH_LOW signals from the phase detectors 340, 344 are provided to respective adjustable delay lines 332, 336 to adjust the delay until the delayed signal A in phase with the signal B and the delayed signal B in phase with the signal C. The SH_HIGH, SH_LOW signals from the phase detectors 340, 344 are also provided to a duty cycle error calculation circuit 356. As will be explained in more detail below, the duty cycle error calculation circuit 356 calculates the delay adjustment necessary to correct the duty cycle of the output clock signals of the DLL 300 by adjusting the adjustable delay line 364 to alter the phase relationship of fclk_sync and rclk_sync signals.

The DCC circuit 308 and the DLL 300 are coupled in a parallel configuration which allows for duty cycle correction to occur in parallel with the locking of the DLL 300. As a result, the time for generating stable, duty cycle corrected clock signals is improved and power and area consumption can be reduced. Additionally, the parallel arrangement of the adjustable delay lines 332, 336 of the DCC circuit 308 to the adjustable delay lines 364, 368 of the DLL 300 reduces the clock jitter due to power supply noise. That is, variations in delay time due to the effect of power supply noise on the delay stages of an adjustable delay line can be minimized because any delay variations are limited to the one adjustable delay line used in generating an output clock signal, namely the delay line 364 for the fclk_sync signal and the delay line 368 for the rclk_sync signal. In contrast, in a conventional arrangement of the DLL 120 and DCC circuit 120, a clock signal is typically propagated through a plurality of adjustable delay lines, each of which having an adjustable delay potentially affected by power supply noise at each delay stage and injecting clock jitter.

The operation of the measuring circuits 330, 350 will now be described with reference to the timing diagram of FIG. 5. The input clock signals CLK and CLK* are complementary to each other and exhibit a notable distortion in the duty cycle. At the rising edge of the CLK signal, such as at time T0, the rCLK signal transitions high and at the falling edge of the CLK signal, such as at time T1, the rCLK signal transitions low. Similarly, the fCLK signal, which is out of phase by 180 degrees with respect to the rCLK signal, transitions high and low relative to the rising and falling edges of the CLK* signal. As known, the rCLK and fCLK signals will be delayed relative to the CLK and CLK* signals respectively, due to the propagation delays of the input clock buffer 360. However, in order to simplify the timing diagram of FIG. 5, the rCLK and fCLk signals are not shown as being delayed relative to the CLK and CLK* signals.

Figure 5:
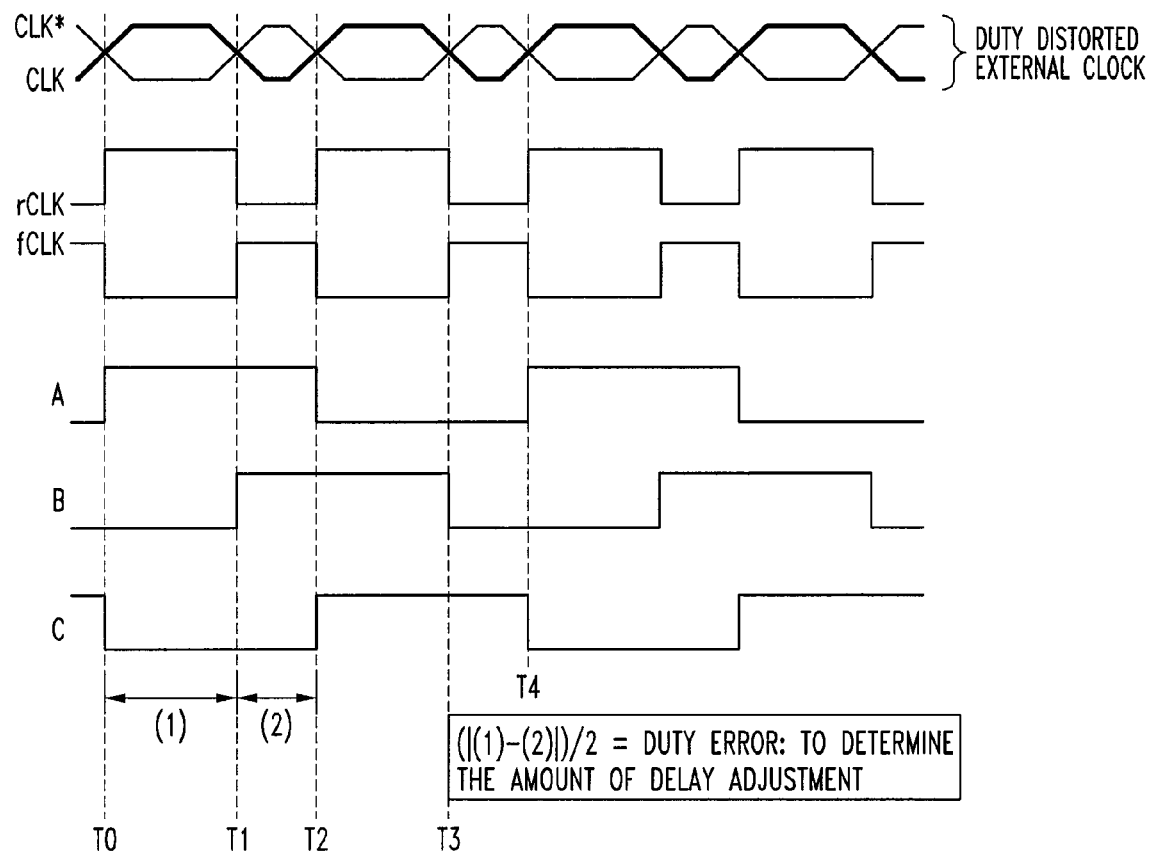
FIG. 5 is a timing diagram of various signals during operation of the clock generator of FIG. 3 in a locked state having duty cycle correction.

As previously discussed, the divider circuit 324 generates the clock signal A having transitions when a rising edge of the rCLK signal crosses a falling edge of the fCLK signal, as occurs at times T0, T2, and T4 (FIG. 5). As a result, the clock signal A generated by the divider circuit 324 has a frequency that is half of the frequency of the rCLK and fCLK signals and has a 50% duty cycle. The signal C is the inverse of the signal A as previously discussed, and is also generated by the divider circuit 324. In contrast, the divider circuit 328 generates the clock signal B having transitions when a rising edge of the fCLK signal crosses a falling edge of the rCLK signal, such as at times T1 and T3. As a result, the clock signal B generated by the divider circuit 328 has a frequency that is half the frequency of the rCLK and fCLK signals and has a 50% duty cycle.

As shown in FIG. 5, the clock signal B is out of phase relative to the clock signal A by a delay (1) that corresponds to a high-cycle of the CLK signal, that is, the time the CLK signal is high (and the CLK* signal is low). As further shown in FIG. 5, the clock signal C is out of phase relative to the clock signal B by a delay (2) that corresponds to a low-cycle of the CLK signal, that is, the time the CLK signal is low (and the CLK* signal is high). The delays (1) and (2) are measured by the measuring circuits 330, 350 using the delay lines 332, 336 and the phase detectors 340, 344. To measure the delay (1), delayed signal A (not shown) is compared to the clock signal B by the phase detector 340. The phase detector 340 will adjust the adjustable delay line 332 until the delayed signal A is in phase with the clock signal B, that is the rising edges of the delayed signal A and the clock signal B are aligned. Consequently, when the signals are in phase, the SH_HIGH signal output by the phase detector 340 to set the delay of the adjustable delay line 332 is indicative of the delay (1). Similarly, to measure the delay (2), the phase detector 344 compares the delayed signal B (not shown) to signal C. As with the phase detector 340 and the adjustable delay line 332, when the adjustable delay line 336 is adjusted by the phase detector 344 so that the delay signal B and the clock signal C are in phase, the SH_LOW signal output by the phase detector 344 is indicative of the delay (2). The SH_HIGH, SH_LOW signals output by the phase detectors 340, 344 are provided to the duty error calculator 356.

The delays (1) and (2) can be used to calculate a duty cycle error from a desired 50% duty cycle. More specifically, the correction for achieving a 50% duty cycle can be determined by calculating half the difference between the delays (1) and (2), that is, the duty cycle error is equal to $(|(1)-(2)|)/2$. As will be explained in more detail below, this calculation is conducted by the duty cycle error calculation circuit 356.

In summary, the duty cycle error calculation circuit 356 compares the delays (1) and (2), and will generate an adjustment signal if necessary. If the delays (1) and (2) are equal, indicating that the rCLK and fCLK signals already have 50% duty cycles, no adjustment is made to achieve a 50% duty cycle. If however, at 630 the delays (1) and (2) are determined to be unequal, the adjustment signal is used to make an adjustment to the delay line 364 of the DLL 300 to correct the duty cycle error. When the delay (1) is greater than the delay (2), indicating a duty cycle of greater than 50% for the CLK signal, the adjustable delay of the delay line 364 in the DLL 300 is adjusted by the duty error calculator 356 to decrease the delay by an amount equal to one-half the difference between delays (1) and (2). In contrast, if the delay (2) is greater than the delay (1), indicating a duty cycle less than 50% for the CLK signal, the adjustable delay of the delay line 364 is increased by an amount equal to one-half the difference between delays (1) and (2).

Figures 6, 7:
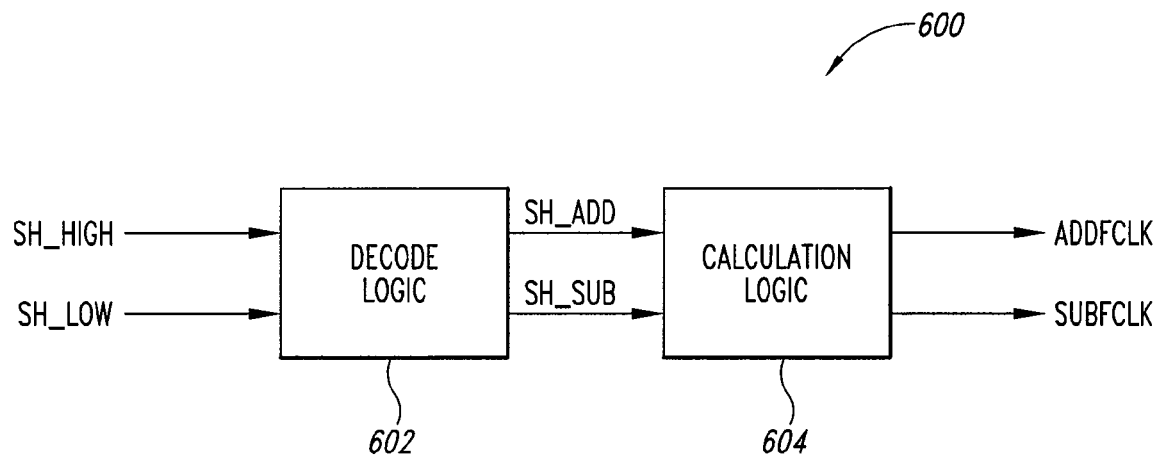
FIG. 6 is a functional block diagram illustrating a duty cycle error calculation circuit according to an embodiment of the invention.
FIG. 7 is a truth table for the decode logic of the duty cycle error calculation circuit of FIG. 6 according to an embodiment of the invention.

FIG. 6 illustrates the duty cycle error calculation circuit 356 according to an embodiment of the present invention. The duty error calculation circuit 356 includes decode logic 602 and calculation logic 604. The decode logic 602 receives the SH_HIGH signal from the phase detector 340 and the SH_LOW signal from the phase detector 344. As previously discussed, the SH_HIGH and SH_LOW signals represent the time of the high- and low-cycles of the CLK signal. As a result, when adjustments are made to the delay lines 332, 336, such as when initially obtaining locked conditions or if the duty cycle of the CLK signal varies, the SH_HIGH, SH_LOW signals also reflect changes to the high- and low-cycles of the CLK signal. For example, the SH_HIGH and SH_LOW signals provide information regarding when the respective adjustable delays 332, 336 are adjusted, and whether the respective delays are increased or decreased. Although shown in FIG. 6 as single signals, the SH_HIGH and SH_LOW signals can each represent multiple signals as well. For example, each of the SH_HIGH and SH_LOW signals can include two separate signals: one to represent when an adjustment is made and another to represent whether the respective delay is increased or decreased. Other arrangements can be used as well.

In response to the SH_HIGH, SH_LOW signals, the decode logic 602 generates appropriate shift signals SH_ADD, SH_SUB that are provided to the calculation logic 604. In one embodiment, the SH_ADD and SH_SUB signals are pulsed signals that are generated in response to the SH_HIGH, SH_LOW signals. As will be explained in further detail below, the SH_ADD and SH_SUB signals are indicative of whether the SH_HIGH, SH_LOW signals reflect a need for adjusting the adjustable delay line 364. The calculation logic 604 receives the SH_ADD, SH_SUB and generates active delay adjustment signals ADDFCLK, SUBFCLK to adjust the delay of the adjustable delay 364 when appropriate. The ADDFCLK, SUBFCLK signals are provided as the delay-adjustment signal shown in FIG. 3. The ADDFCLK signal increases the delay of the adjustable delay 364 and the SUBFCLK signal decreases the delay of the adjustable delay 364.

The duty cycle error calculation circuit 356 provides the ADDFCLK, SUBFCLK signals to adjust the delay of the adjustable delay 364 without the need for the high-cycle measuring circuit 330 and the low-cycle measuring circuit 350 to first achieve a locked condition. That is, the duty cycle error calculation circuit 356 provides the appropriate ADDFCLK, SUBFCLK signals to the adjustable delay 364 for adjusting the delay while the high- and low-portions of input clock signal CLK are being determined. Additionally, the duty cycle error calculation circuit 356 can continually monitor the SH_HIGH and SH_LOW signals from the phase detectors 340, 344 for changes in the duty cycle of the CLK signal and respond by adjusting the delay of the adjustable delay 364 accordingly.

FIG. 7 illustrates a truth table 700 for operation of the decode logic 602 according to one embodiment of the invention. The truth table 700 illustrates the conditions under which the decode logic 602 indicates no delay adjustment is needed (No output), the delay should be decreased (SH_SUB), or the delay should be increased (SH_ADD) in response to the SH_HIGH and SH_LOW signals. For example, where the combination of the SH_HIGH and SH_LOW signals indicate that (1) no adjustment has been made to either of the adjustable delay lines 332, 336 (None, None), (2) both the adjustable delay lines 332, 336 have been adjusted to decrease delay (Shift Right, Shift Right), or (3) both the adjustable delay lines 332, 336 have been adjusted to increase delay (Shift Left, Shift Left), the decode logic 602 provides inactive SH_ADD and SH_SUB signals to the calculate logic 604. These situations can be described as cases where the duration of the high-cycle and the low-cycle remain the same relative to one another. Consequently, there is no need to adjust the delay of the adjustable delay line 364. One example is when the adjustable delay lines 332, 336 are adjusted after a reset event to measure the high- and low-cycles of the CLK signal. In this example, after being reset to a minimum delay, both the respective delays of the adjustable delay lines 332 and 336 will likely initially increase concurrently. As the delays are increasing concurrently, the decode logic 602 does not output active SH_ADD or SH_SUB signals.

Where the combination of SH_HIGH and SH_LOW signals indicate that (1) only the delay of the adjustable delay line 336 is decreased (None, Shift Right), (2) the delay of the adjustable delay line 332 is increased and the delay of the adjustable delay line 336 is decreased (Shift Left, Shift Right), or (3) only the delay of the adjustable delay line 332 is increased (Shift Left, None), the decode logic 602 provides an active SH_SUB signal to the calculation logic 604 indicating that the delay of the adjustable delay line may need to be decreased to account for changes in the duty cycle, as measured by the high- and low-cycle measuring circuits 330, 350. These situations can be described as cases where the duty cycle is increasing (i.e., the high-cycle is increasing relative to the low-cycle, and/or the low cycle is decreasing relative to the high-cycle). As a result, the delay of the adjustable delay line 364 may need to be decreased to correct or to maintain adequate correction for duty cycle distortion.

Finally, where the combination of SH_HIGH and SH_LOW signals indicate that (1) only the delay of the adjustable delay line 336 is increased (None, Shift Left), (2) the delay of the adjustable delay line 332 is decreased and the delay of the adjustable delay line 336 is increased (Shift Right, Shift Left), or (3) only the delay of the adjustable delay line 332 is decreased (Shift Right, None), the decode logic 602 provides an active SH_ADD signal to the calculate logic 604 indicating that the delay of the adjustable delay line may need to be increased to account for changes in the duty cycle, as measured by the high- and low-cycle measuring circuits 330, 350. These situations can be described as cases where the duty cycle is decreasing (i.e., the high-cycle is decreasing relative to the low-cycle, and/or the low cycle is increasing relative to the high-cycle). As a result, the delay of the adjustable delay line 364 may need to be increased to correct or to maintain adequate correction for duty cycle distortion.

Figure 8A:
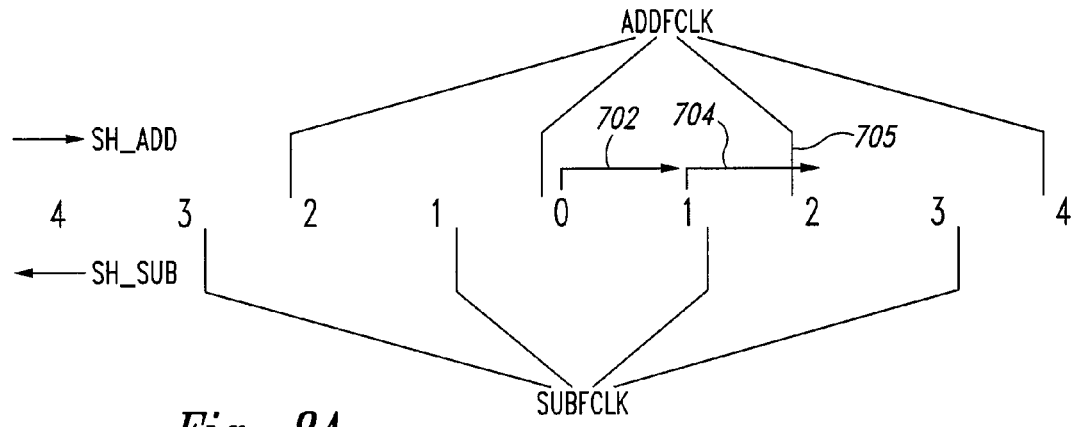
FIGS. 8A-8C are diagrams illustrating operation of the calculation logic of the duty cycle error calculation circuit of FIG. 6 according to an embodiment of the invention.
Figure 8B:
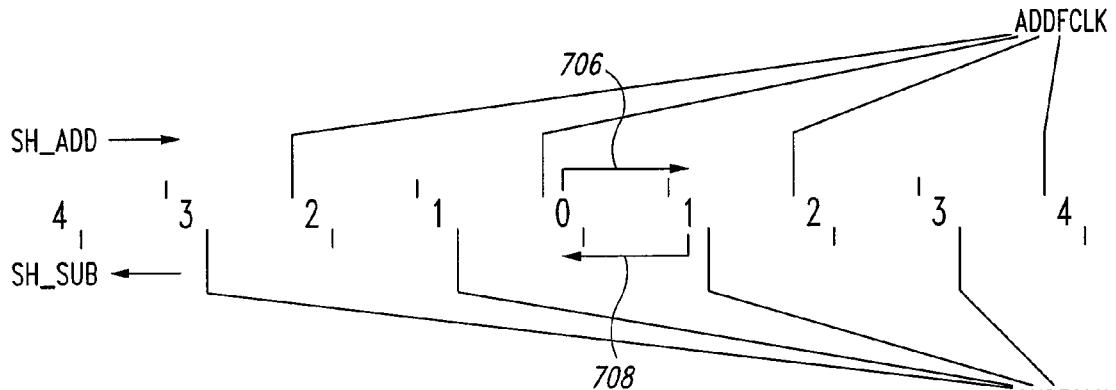
Figure 8C:
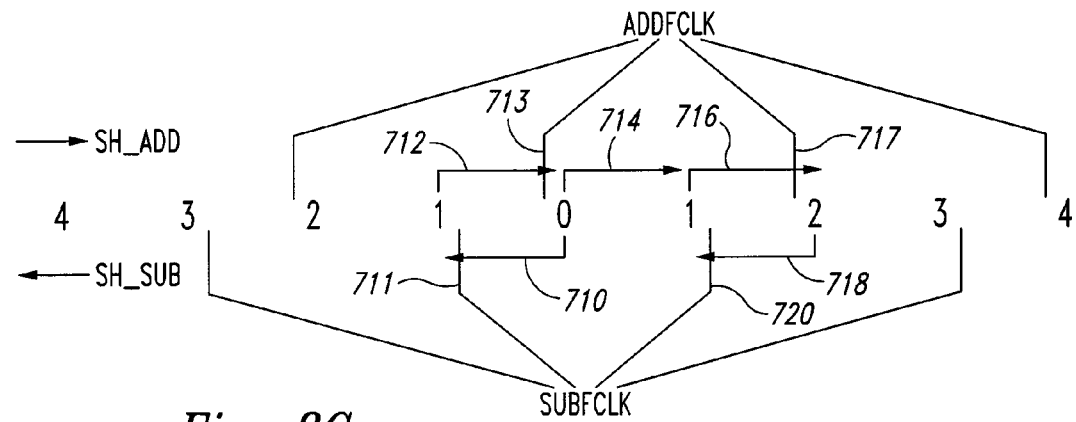

FIGS. 8A-8C are diagrams illustrating operation of the calculation logic 604 according to an embodiment of the present invention. As previously discussed, the calculation logic 604 receives the SH_ADD, SH_SUB signals from the decode logic 602 and generates active ADDFCLK, SUBFCLK signals when appropriate to adjust the delay of the adjustable delay line 364. As previously discussed, to correct duty cycle error the adjustable delay line 364 is adjusted to one-half of the difference between the high-portion of the clock signal and the low-portion of the clock signal, as measured by the high- and low-cycle measuring circuits 330, 350. In an embodiment where the adjustable delay line 364, and the adjustable delay lines 332, 336 are implemented such that delay is increased and decreased in the same incremental amounts, the calculation logic 604 adjusts the adjustable delay line 364 one incremental delay when the difference between the delays of adjustable delay line 332 and the adjustable delay line 336 is two incremental delays. FIGS. 8A-8C illustrate operation under this case. As shown in FIGS. 8A-8C, movement one increment to the left is in response to an active SH_SUB signal and movement one increment to the right is in response to an active SH_ADD signal. "Movement" in the right or left directions is conceptual, and does not actually occur in the calculation logic 604. That is, the use of movement in FIGS. 8A-8C to describe operation of the calculation logic 604 is for the purpose of simplifying the explanation and is not intended to suggest actual movement. Initially, a "count" is zero. As SH_ADD and SH_SUB signals are received by the calculation logic 604, the count is tracked so that active ADDFCLK, SUBFCLK signals will be generated appropriately. As previously discussed, the SH_ADD and SH_SUB signals from the decode logic 602 are indicative of the changes in the adjustable delays 332 and 336, respectively, which reflect changes in the duty cycle of the CLK signal, or upon start-up, adjustment of the delays 332, 336 to initially measure the high- and low-cycles of the CLK signal.

FIG. 8A illustrates a situation where a first active SH_ADD signal is received by the calculation logic 604, followed by receipt of another active SH_ADD signal. This situation can occur when the decode logic 602 receives a SH_HIGH signal indicating a shift right delay adjustment of the adjustable delay line 332 (e.g., Shift Right, None, with reference to FIG. 7), followed at some later time by another SH_HIGH signal indicating a shift right delay adjustment (e.g., Shift Right, None). This may occur where the duty cycle of the CLK signal had decreased, thus requiring additional delay to be added to the adjustable delay line 364 to maintain a corrected 50% duty cycle. In response to the first active SH_ADD signal, movement to the right occurs, as indicated by arrow 702 in FIG. 8A. At this time, although there has been a change in the relationship between the high- and low-cycles of the CLK signal, as reflected by the SH_ADD signal, no adjustment is made to the delay of the adjustable delay line 364 because in the presently discussed embodiment of the invention, the incremental delay of the adjustable delay line 364 (i.e., delay resolution) is not sufficient to accommodate just one incremental delay change of the adjustable delay lines 332, 336. In response to the second active SH_ADD signal, further movement to the right occurs, as indicated by arrow 704. As a result of the second SH_ADD signal, the calculation logic 604 generates an active ADDFCLK signal (represented as event 705) to adjust the adjustable delay line 364. The ADDFCLK causes the delay of the adjustable delay line 364 to increase. As illustrated by the example of FIG. 8A, the calculation logic 604 generates control signals to adjust the delay by one incremental delay in response to changes in the adjustable delays 332, 336 that result in a time difference between the high- and low-cycles equal to two incremental delays.

FIG. 8B illustrates a situation where an active SH_ADD signal is received and an active SH_SUB signal is subsequently received by the calculate logic 604. This may occur when the decode logic 602 receives a SH_HIGH signal indicating a shift right delay adjustment (e.g., Shift Right, None, with reference to FIG. 7) followed at a later time by a SH_LOW signal indicating a shift left delay adjustment (e.g., Shift Left, None, with reference to FIG. 7). Receipt by the calculation logic 604 of the SH_ADD signal is represented in FIG. 8B by arrow 706 and receipt of the SH_SUB signal is represented in FIG. 8B by arrow 708. As a result of the movement to the right in FIG. 8A followed by movement back to the left, it is as though no variation in the relationship between the high- and low-cycles of the CLK signal ever occurred. Consequently, neither an active ADDFCLK or SUBFCLK signal is generated by the calculation logic 604.

FIG. 8C illustrates a more complicated example than either FIG. 8A or 8B. An active SH_SUB signal is received by the calculation logic 604, which results in movement in the diagram of FIG. 8C to the left, as represented by arrow 710. In response to the movement to the left, the calculation logic 604 generates an active SUBFCLK signal (represented by event 711) that causes the delay of the adjustable delay 364 to decrease by one incremental delay. In contrast to the example of FIG. 8A, which required two movements to the right from an initial condition to cause an incremental delay increase for the adjustable delay 364, one movement to the left from the initial condition results in an incremental delay decrease for the adjustable delay 364. As will be explained in more detail below, the incongruency between the results from movement to the right and movement to the left from the initial condition is the result of a particular embodiment of the calculation logic 604. In other embodiments of the invention, the results from movement to the right and to the left from the initial condition is balanced.

At a later time after movement to the left as shown by arrow 710, the calculation logic 604 receives an active SH_ADD signal causing movement to the right, as represented in FIG. 8C by arrow 712, back to the initial condition. In response, the calculation logic 604 generates an active ADDFCLK signal (represented by event 713) to cause the delay of the adjustable delay 364 to increase. Note that the increase in the delay of the adjustable delay 364 at event 713 "adds back" delay from the decrease in delay from event 711. The net result is that the delay of the adjustable delay 364 is the same as before event 711 upon returning to the initial condition by the movement to the right (arrow 712).

At a later time the calculation logic 604 receives an active SH_ADD signal that causes movement to the right, as shown by arrow 714 in the diagram of FIG. 8C. The movement to the right does not result in any adjustment of the delay of the adjustable delay 364 since one-half of the difference between the high- and low-cycles of the CLK signal is less than the incremental delay of the adjustable delay line 364. However, at a later time another active SH_ADD signal received by the calculation logic 604 results in the generation of an active ADDFCLK signal that increases the delay of the adjustable delay line 364 by one incremental delay. The movement to the right in response to the SH_ADD signal is represented by arrow 716 and the generation of the active ADDFCLK signal is represented by event 717. The delay of the adjustable delay line 364 is adjusted because the difference between the high- and low-cycle of the CLK signal, as measured by the measuring circuits 330, 350 is approximately equal to two incremental delays of the adjustable delay lines 332, 336. Consequently, the adjustable delay line 364 is adjusted one incremental delay to maintain an adjusted 50% duty cycle.

At a later time, the calculation logic 604 receives an active SH_SUB signal, which causes movement back to the left, which is represented in FIG. 8C by arrow 718. In response, the calculation logic 604 generates an active SUBFCLK signal (event 720) to incrementally reduce the delay of the adjustable delay line 364. As previously discussed, the particular implementation for one embodiment of the invention results in an incongruency in adjustment of the adjustable delay line 364 between movement to the right and left. However, the error in delay resulting from offsetting the increasing and decreasing adjustment events may be acceptable in many applications. Although not shown in FIG. 8C, another shift to the right (resulting from receiving an active SH_ADD signal)

will result in the delay of the adjustable delay line 364 being increased, while two shifts to the left (resulting from receiving two active SH_SUB signals) will result in the delay of the adjustable delay line 364 being decreased.

In summary, the examples shown in FIG. 8A-8C illustrate operation of the calculation logic 604 according to one embodiment of the invention and further illustrates a tracking function that is performed by the calculation logic 604 to track changes in the relative relationship between the high- and low-cycles of the CLK signal as measured by the measuring circuits 330, 350. The tracking function enables to calculation logic 604 to accurately adjust the adjustable delay line 364 accordingly in response to changes in the duty cycle of the CLK signal.

Figure 9:
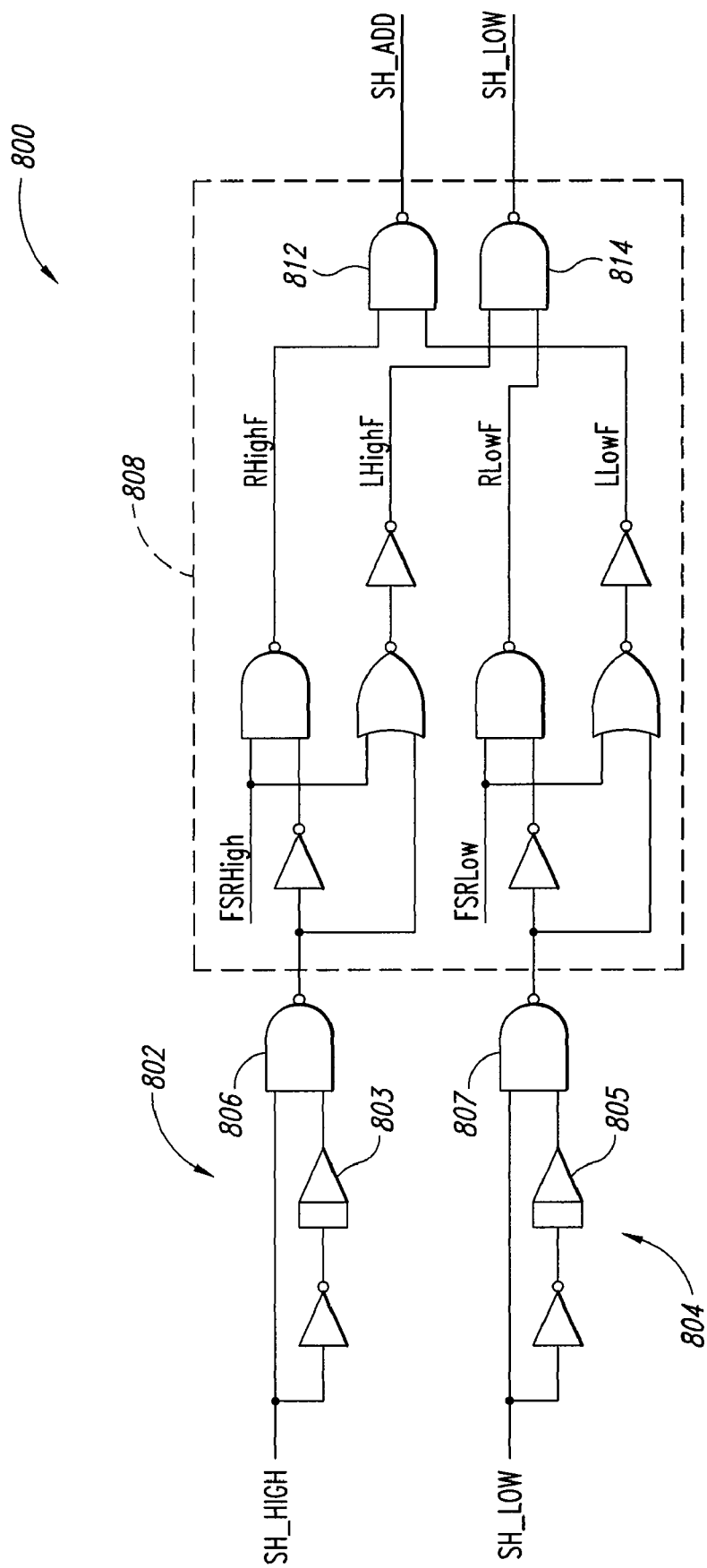
FIG. 9 is a schematic diagram of the decode logic according to an embodiment of the invention.

FIG. 9 illustrates decode logic 800 according to an embodiment of the present invention. The decode logic can be substituted for the decode logic 602 shown in FIG. 6. The decode logic 800 includes pulse generation circuits 802, 804 that generate respective pulses in response to active SH_HIGH and SH_LOW signals. A delay circuit 803 in the pulse generation circuit 802 is used to set the pulse width of an output pulse from NAND gate 806 and a delay circuit 805 in the pulse generation circuit 804 is used to set the pulse width of an output pulse from NAND gate 807. Logic circuitry 808 is coupled to the output of the pulse generation circuits 802, 804 to receive the respective pulses and provide the appropriate SH_ADD and SH_LOW signals from NAND gates 812 and 814, respectively, in response. In addition to receiving the output of the pulse generation circuits, the logic circuitry 808 receives respective shift direction signals FSRHigh, FSR-Low. The FSRHigh signal is indicative of decreasing delay (right shift) of the adjustable delay line 332 when active and indicative of increasing delay (left shift) when inactive. The FSRLow signal is indicative of decreasing delay (right shift) of the adjustable delay line 332 when active and indicative of increasing delay (left shift) when inactive. The decode logic 800 operates as previously discussed with reference to FIGS. 6 and 7.

Figure 10:
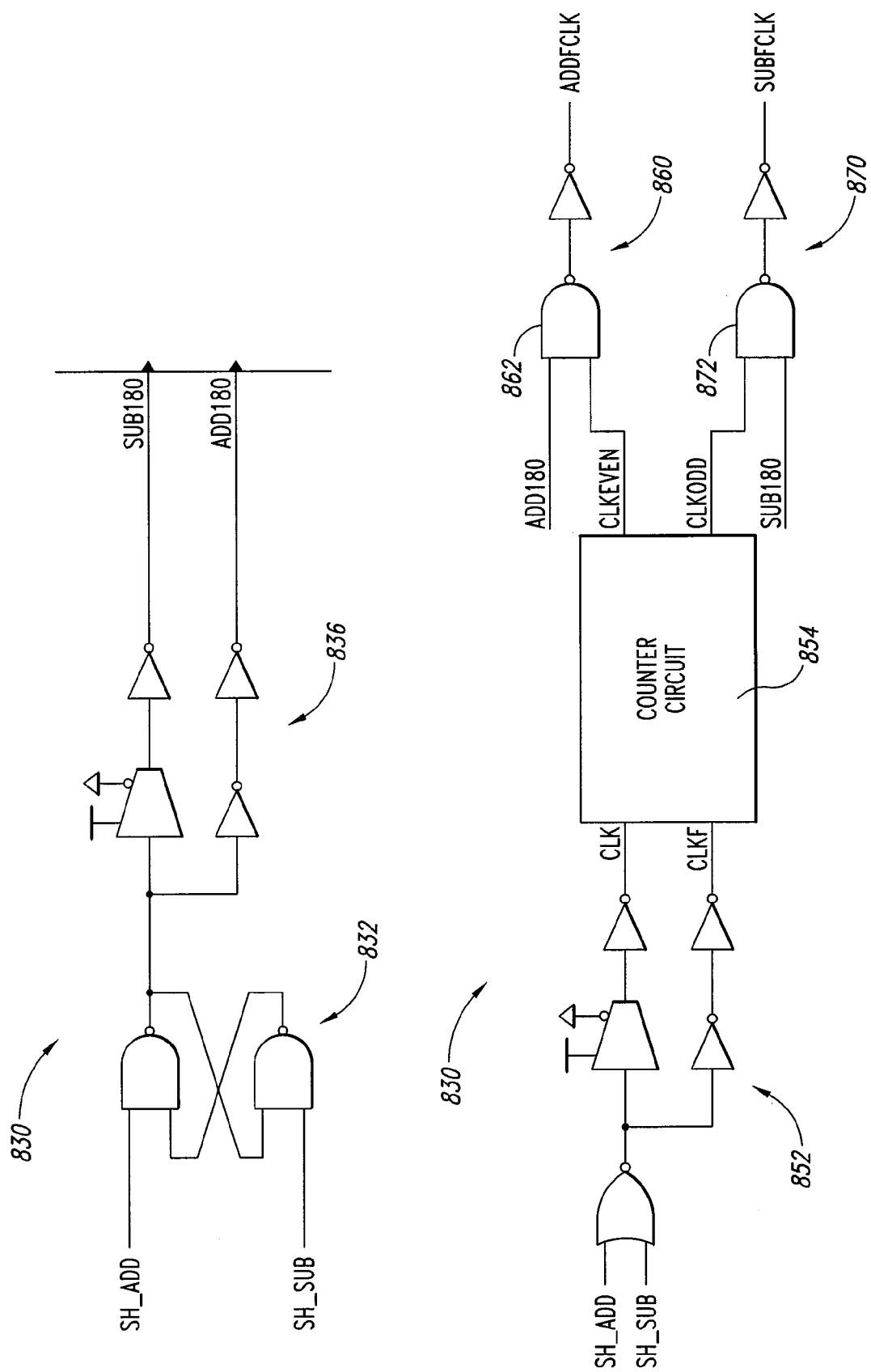
FIG. 10 is a schematic diagram of the calculation logic according to an embodiment of the invention.

FIGS. 10A and 10B illustrate sub-circuits 830 and 850 included in calculation logic 1000 according to an embodiment of the present invention. The calculation logic 1000 can be substituted for the calculation logic 604 shown in FIG. 6. The sub-circuit 830 provides tracking functionality for the calculation logic 1000 previously discussed with respect to FIGS. 8A-8C. An active low input latch 832 receives the SH_ADD and SH_LOW signals from the decode logic 602 and provides an output signal to output stage 836. The output stage 836 provides complementary output signals Sub180, Add180 which have logic states that can be used to track changes in the high- and low-cycles of the CLK signal, as measured by measuring circuits 330, 350 and reflected by active SH_ADD and SH_LOW signals. The sub-circuit 850 includes input logic 852 that receives the SH_ADD and SH_LOW signals and provides complementary clock signals to drive a counter circuit 854. The counter circuit 854 counts in response to the complementary clock signals and generates an active output signal CLKEVEN when the count is an even number and generates an active output signal CLKODD when the count is an odd number. The counter circuit 854 can be implemented using conventional designs and circuitry known to those ordinarily skilled in art. The CLKEVEN and CLKODD signals are provided to output stages 860, 870, respectively. The output stage 860 further receives the Add180 signal from the sub-circuit 830 and the output stage 870 further receives the Sub180 signal. As previously described, where delays are adjusted by incremental delays, the adjustable delay line 364 is adjusted one incremental delay in response to changes in the high- and low-cycle that result in a difference of two incremental delays. Active Sub180 and Add180 signals represent a change by a first incremental delay and active CLKEVEN and CLKODD signals represent a change by a second incremental delay. By logically combining the Add180 and CLKEVEN signals through NAND gate 862, an active ADDFCLK signal is generated only when appropriate to adjust the adjustable delay line 364. Similarly, by logically combining the Sub180 and CLKODD signals through NAND gate 872, an active SUB-FCLK signal is generated only when appropriate to adjust the adjustable delay line 364.

The embodiment of the duty cycle error calculation circuit 356 previously described generates delay adjustment signals for adjusting the adjustable delay line 364 to provide and maintain a corrected 50% duty cycle. In alternative embodiments of the invention, a duty cycle error calculation circuit provides control signals for both the adjustable delay lines 364 and 368 to adjust the respective delays to change the phase relationship between the fclk_sync and rclk_sync signals for duty cycle correction. In this alternative embodiment, adjusting either of the adjustable delay lines 364, 368 provides greater flexibility to reduce forward delay of a clock signal, and thus, reduce susceptibility to power-line induced jitter. Modifications to practice the alternative embodiments are well within the understanding of those ordinarily skilled in the art, and in the interest of brevity, will not be discussed in anymore detail.

Figure 1:
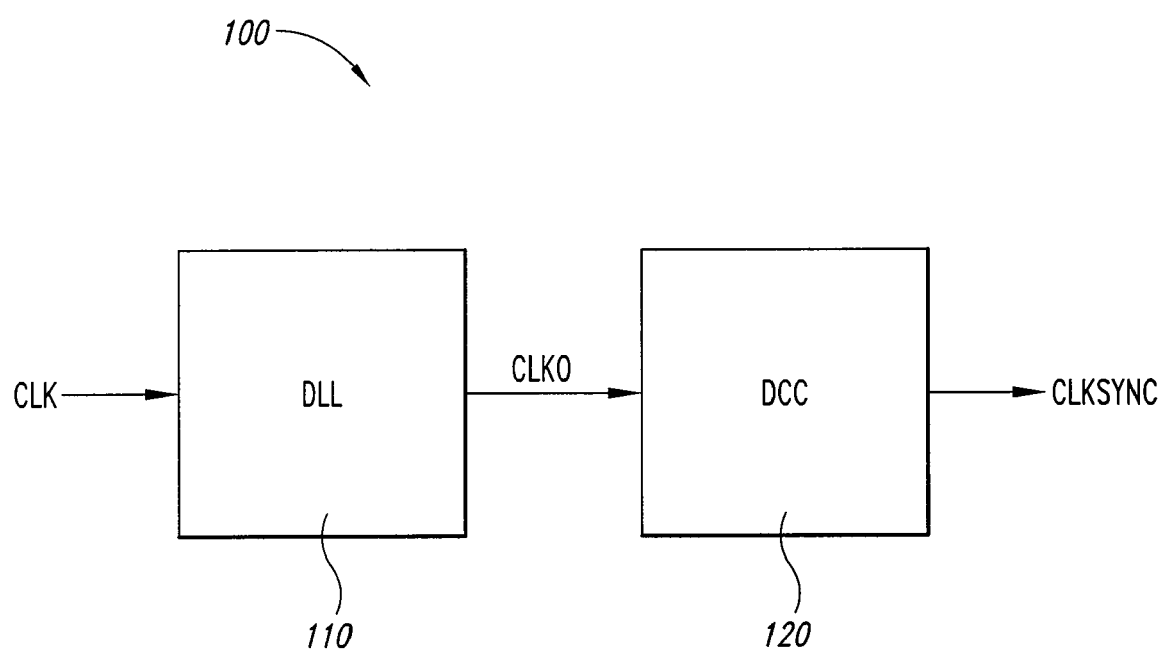
FIG. 1 is a functional block diagram of a conventional clock generator.
Figure 2:
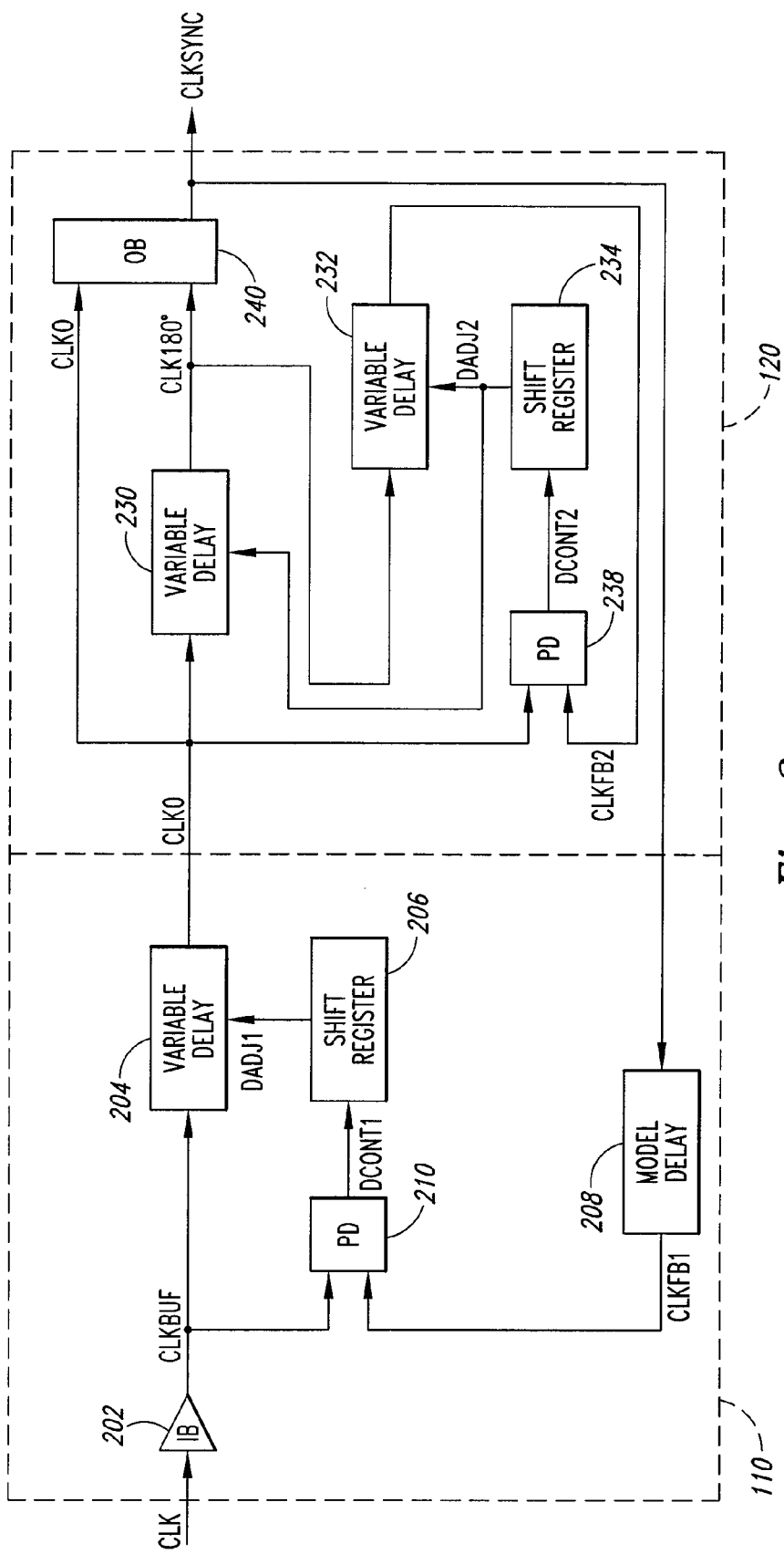
FIG. 2 is a functional block diagram of a conventional clock generator illustrating a conventional delay locked loop and duty cycle correction circuit.
Figure 11:
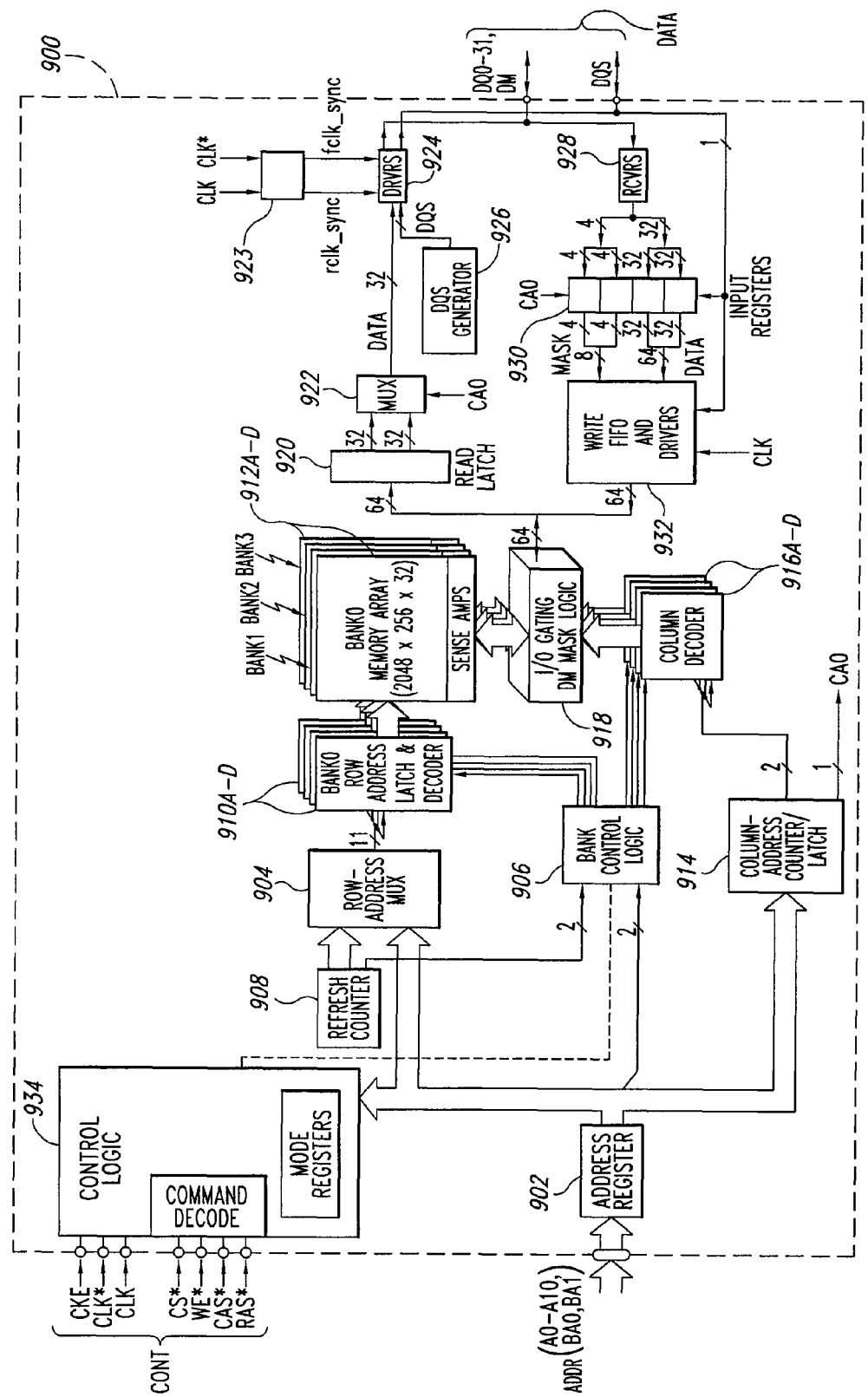
FIG. 11 functional block diagram illustrating a synchronous memory device including a clock generator having a duty cycle error calculation circuit according to an embodiment of the invention.

FIG. 11 is a functional block diagram of a memory device 900 including a clock generator 923 having a duty cycle error calculation circuit according to an embodiment of the present invention. The memory device 900 in FIG. 1 is a double-data rate ("DDR") SDRAM, although the principles described herein are applicable to any memory device that may include a delay-locked loop for synchronizing internal and external signals, such as conventional SDRAMs, as well as packetized memory devices like SLDRAMs and RDRAMs, and are equally applicable to any integrated circuit that must synchronize internal and external clocking signals.

The memory device 900 includes an address register 902 that receives row, column, and bank addresses over an address bus ADDR, with a memory controller (not shown) typically supplying the addresses. The address register 902 receives a row address and a bank address that are applied to a row address multiplexer 904 and bank control logic circuit 906, respectively. The row address multiplexer 904 applies either the row address received from the address register 902 or a refresh row address from a refresh counter 908 to a plurality of row address latch and decoders 910A-D. The bank control logic 906 activates the row address latch and decoder 910A-D corresponding to either the bank address received from the address register 902 or a refresh bank address from the refresh counter 908, and the activated row address latch and decoder latches and decodes the received row address. In response to the decoded row address, the activated row address latch and decoder 910A-D applies various signals to a corresponding memory bank 912A-D to thereby activate a row of memory cells corresponding to the decoded row address. Each memory bank 912A-D includes a memory-cell array having a plurality of memory cells arranged in rows and columns, and the data stored in the memory cells in the activated row is stored in sense amplifiers in the corresponding memory bank. The row address multiplexer 904 applies the refresh row address from the refresh counter 908 to the decoders 910A-D and the bank control logic circuit 906 uses the refresh bank address from the refresh counter when the memory device 900 operates in an auto-refresh or self-refresh mode of operation in response to an auto- or self-refresh command being applied to the memory device 900, as will be appreciated by those skilled in the art.

A column address is applied on the ADDR bus after the row and bank addresses, and the address register 902 applies the column address to a column address counter and latch 914 which, in turn, latches the column address and applies the latched column address to a plurality of column decoders 916A-D. The bank control logic 906 activates the column decoder 916A-D corresponding to the received bank address, and the activated column decoder decodes the applied column address. Depending on the operating mode of the memory device 900, the column address counter and latch 914 either directly applies the latched column address to the decoders 916A-D, or applies a sequence of column addresses to the decoders starting at the column address provided by the address register 902. In response to the column address from the counter and latch 914, the activated column decoder 916A-D applies decode and control signals to an I/O gating and data masking circuit 918 which, in turn, accesses memory cells corresponding to the decoded column address in the activated row of memory cells in the memory bank 912A-D being accessed.

During data read operations, data being read from the addressed memory cells is coupled through the I/O gating and data masking circuit 918 to a read latch 920. The I/O gating and data masking circuit 918 supplies N bits of data to the read latch 920, which then applies two N/2 bit words to a multiplexer 922. The circuit 918 provides 64 bits to the read latch 920 which, in turn, provides two 32 bits words to the multiplexer 922. A data driver 924 sequentially receives the N/2 bit words from the multiplexer 922 and also receives a data strobe signal DQS from a strobe signal generator 926 and a delayed complementary clock signals fclk_sync and rclk_sync from the clock generator 923. The DQS signal is used by an external circuit such as a memory controller (not shown) in latching data from the memory device 900 during read operations. In response to the delayed complementary clock signals fclk_sync and rclk_sync, the data driver 924 sequentially outputs the received N/2 bits words as a corresponding data word DQ, each data word being output in synchronism with rising and falling edges of the CLK and CLK* signals that are applied to clock the memory device 900. The data driver 924 also outputs the data strobe signal DQS having rising and falling edges in synchronism with rising and falling edges of the CLK and CLK* signals, respectively. Each data word DQ and the data strobe signal DQS collectively define a data bus DATA. As will be appreciated by those skilled in the art, the fclk_sync and rclk_sync signals from the DLL are delayed versions of the complementary CLK and CLK* signals, and the clock generator 923 adjusts the delay of the fclk_sync and rclk_sync signals relative to the CLK and CLK* signals to ensure that the DQS signal and the DQ words are placed on the DATA bus in synchronism with the CLK and CLK* signals, as previously described. The DATA bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM on the data bus DATA. A data receiver 928 receives each DQ word and the associated DM signals, and applies these signals to input registers 930 that are clocked by the DQS signal. In response to a rising edge of the DQS signal, the input registers 930 latch a first N/2 bit DQ word and the associated DM signals, and in response to a falling edge of the DQS signal the input registers latch the second N/2 bit DQ word and associated DM signals. The input register 930 provides the two latched N/2 bit DQ words as an N-bit word to a write FIFO and driver 932, which clocks the applied DQ word and DM signals into the write FIFO and driver in response to the DQS signal. The DQ word is clocked out of the write FIFO and driver 932 in response to the CLK signal, and is applied to the I/O gating and masking circuit 918. The I/O gating and masking circuit 918 transfers the DQ word to the addressed memory cells in the accessed bank 912A-D subject to the DM signals, which may be used to selectively mask bits or groups of bits in the DQ words (i.e., in the write data) being written to the addressed memory cells.

A control logic and command decoder 934 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 934 latches and decodes an applied command, and generates a sequence of clocking and control signals that control the components 902-932 to execute the function of the applied command. The clock enable signal CKE enables clocking of the command decoder 934 by the clock signals CLK, CLK*. The command decoder 934 latches command and address signals at edges of the CLK, CLK* signals (i.e., the crossing point of CLK going high and CLK* going low), while the input registers 930 and data drivers 924 transfer data into and from, respectively, the memory device 900 in response to both edges of the data strobe signal DQS and thus at double the frequency of the clock signals CLK, CLK*. This is true because the DQS signal has the same frequency as the CLK, CLK* signals. The memory device 900 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 934 in generating the control and timing signals is conventional, and thus, for the sake of brevity, will not be described in more detail.

Figure 12:
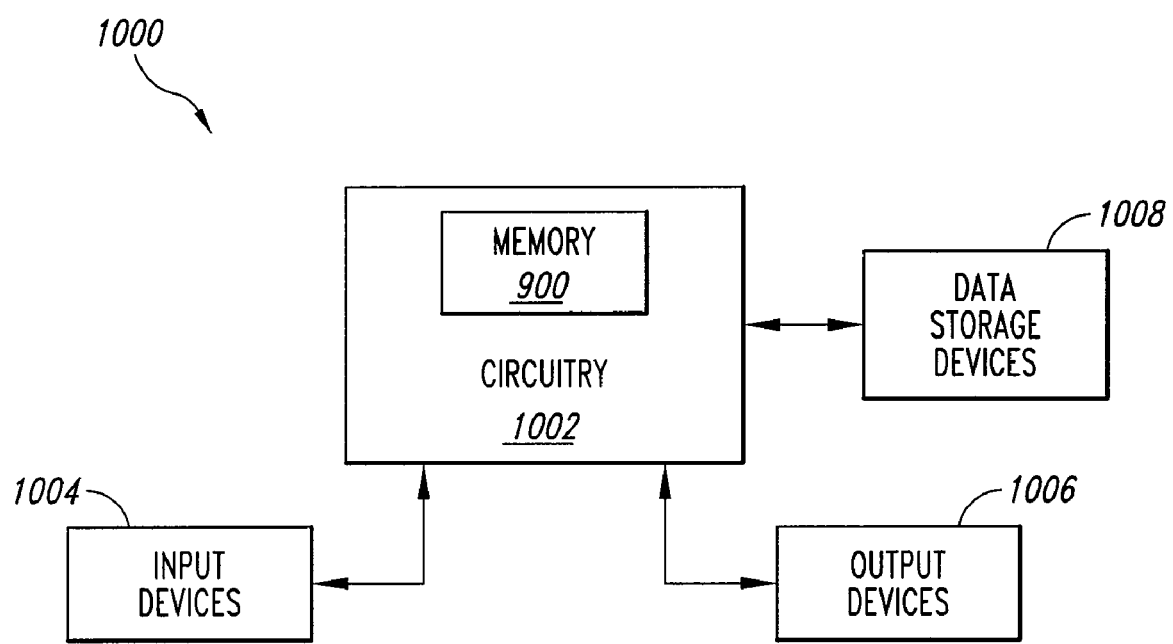
FIG. 12 is a functional block diagram illustrating a processor-based system including the synchronous memory device of FIG. 11.

FIG. 12 is a block diagram of a processor-based system 1000 including processor circuitry 1002, which includes the memory device 900 of FIG. 11. Typically, the processor circuitry 1002 is coupled through address, data, and control buses to the memory device 900 to provide for writing data to and reading data from the memory device. The processor circuitry 1002 includes circuitry for performing various processing functions, such as executing specific software to perform specific calculations or tasks. In addition, the processor-based system 1000 includes one or more input devices 1004, such as a keyboard or a mouse, coupled to the processor circuitry 1002 to allow an operator to interface with the processor-based system 1000. Typically, the processor-based system 1000 also includes one or more output devices 1006 coupled to the processor circuitry 1002, such as output devices typically including a printer and a video terminal. One or more data storage devices 1008 are also typically coupled to the processor circuitry 1002 to store data or retrieve data from external storage media (not shown). Examples of typical storage devices 1008 include hard and floppy disks, tape cassettes, compact disk read-only ("CD-ROMs") and compact disk read-write ("CD-RW") memories, and digital video disks ("DVDs").

From the foregoing it will be appreciated that, although specific embodiments of the invention have been described herein for purposes of illustration, various modifications may be made without deviating from the spirit and scope of the invention. Such modifications are well within the skill of those ordinarily skilled in the art. Accordingly, the invention is not limited except as by the appended claims.

What is claimed is:

1. A method for generating a correction signal for correcting duty cycle error of a first clock signal relative to a second complementary clock signal, the method comprising:

detecting a time difference between high- and low-portions of the first clock signal by measuring the high-portion and the low-portion of the first clock signal, the high-portion of the first clock signal is the time of a clock period the clock signal is high and the low-portion of the first clock signal is the time of the clock period the clock signal is low;

generating signals indicative of incremental increases and decreases in the difference between the high- and low-portions of the first clock signal;

generating the correction signal to change the phase relationship of the first and second complementary clock signals by increasing or decreasing the phase by an incremental change in response to the signals indicating a time difference between the high- and low-portions of the first clock signal of two incremental increases or decreases;

counting occurrences of the signals indicative of incremental increasing and decreasing differences between the high- and low-portions of the first clock signal in a first direction in response to the signals indicative of an increasing time difference between the high- and low-portions of the first clock signal; and counting occurrences of the signals indicative of incremental increasing and decreasing differences between the high- and low-portions of the first clock signal in a second direction in response to the signals indicative of decreasing time difference between the high- and low-portions of the first clock signal.

2. The method of claim 1 wherein measuring the high- and low-portions of the first clock signal comprise:

adjusting first and second adjustable delays to lock respective delay locked loops.

3. The method of claim 1 wherein generating the correction signal comprises:

generating an active correction signal to increase a phase relationship between the first and second clock signals in response to two incremental increases in the time difference; and generating an active correction signal to decrease the phase relationship of the first and second clock signals in response to two incremental decreases in the time difference.

4. The Method of claim 1 wherein generating the correction signal comprises:

generating an active correction signal to increase or decrease the phase relationship of the first and second clock signals by one incremental delay in response to detecting changes in the time difference between high- and low-portions of the first clock signal equal to two incremental delays.

5. A method for generating a delay control signal to adjust a delay circuit for maintaining a phase relationship between a first clock signal and a second complementary clock signal, the method comprising:

generating the delay control signal responsive to a time difference between first and second portions of the first clock signal, the first portion between a rising edge and a falling edge of a clock cycle and the second portion between the falling edge and a next rising edge of the clock cycle, the delay control signal indicative of a delay adjustment due to the time difference to maintain the phase relationship between the first clock signal and the second complementary clock signal;

increasing a delay responsive to the delay control signal for at least one of the first and second clock signals in response to two incremental increases in the time difference;

decreasing the delay responsive to the delay control signal for at least one of the first and second clock signals in response to two incremental decreases in the time difference; and counting in a first direction in response to increases in the time difference between first and second portions of the first clock signal and counting in a second direction in response to decreases in the time difference between first and second portions of the first clock signal.

6. A method for generating a correction signal for correcting duty cycle error of a first clock signal relative to a second complementary clock signal, the method comprising:

detecting changes to a time difference between when the first clock signal is high during a clock period and when the first clock signal is low during the clock period;

generating an active correction signal in response to and accordance with the detected changes to increase or decrease the phase relationship of the first and second clock signals by one incremental delay in response to detecting changes in the time difference between when the first clock signal is high during the clock period and when the first clock signal is low during the clock period equal to two incremental delays; and counting in a first direction in response to increases in the time difference between high- and low-portions of the first clock signal and counting in a second direction in response to decreases in the time difference between when the first clock signal is high during the clock period and when the first clock signal is low during the clock period.

7. A duty cycle correction circuit for generating a correction signal for changing a phase relationship of first and second complementary clock signals to provide duty cycle corrected clock signals, the duty cycle correction circuit comprising:

a first circuit operable to generate a first signal indicative of a time period of a clock cycle the first clock signal is high;

a second circuit operable to generate a second signal indicative of a time period of the clock cycle the first clock signal is low;

decode logic coupled to the first and second circuits and operable to generate delay adjustment signals in response to the first and second signals; and a counter circuit coupled to the decode logic and operable to count occurrences of delay adjustment signals indicative of increasing and decreasing differences between time periods the first clock signal is high and low during the clock cycle, the counter circuit operable to count in a first direction in response to adjustment signals indicative of an increasing difference and count in a second direction in response to adjustment signals indicative of a decreasing difference.

8. The duty cycle correction circuit of claim 7 wherein the first circuit comprises:

a delay-locked loop having an adjustable delay line and a phase detector operable to generate a delay control signal for adjusting the adjustable delay to achieve a locked condition, the delay of the adjustable delay line when locked representative of the time period the first clock signal is high during the clock cycle, the delay control signal provided by the first circuit as the first signal.

9. The duty cycle correction circuit of claim 7 wherein the second circuit comprises:
a delay-locked loop having an adjustable delay line and a phase detector operable to generate a delay control signal for adjusting the adjustable delay to achieve a locked condition, the delay of the adjustable delay line when locked representative of the time period the first clock signal is low during the clock cycle, the delay control signal provided by the second circuit as the second signal.

10. A duty cycle correction circuit, comprising:
a measuring circuit operable to generate signals indicative of a time difference between a high-portion and a low portion of a clock signal, the high-portion between a rising edge and a falling edge of the clock signal during a clock period and the low-portion between the falling edge and a next rising edge of the clock signal during the clock period;
decode logic coupled to the measuring circuit and operable to generate delay adjustment signals;
a counter circuit operable to count occurrences of active delay adjustment signals indicative of increasing and decreasing time differences between the high- and low-portions of the clock signal, the counter circuit operable to count in a first direction in response to active adjustment signals indicative of an increasing time difference and count in a second opposite direction in response to active adjustment signals indicative of a decreasing time difference; and
logic circuitry coupled to the decode logic and operable to generate a control signal based in part on the count of the counter circuit, the control signal changing the phase relationship of the clock signal and a complementary clock signal by increasing and decreasing the phase by an incremental change.

11. The duty cycle correction circuit of claim 10 wherein the measuring circuit comprises:
a first circuit operable to generate a first signal indicative of a time period of the high-portion of the clock signal; and
a second circuit operable to generate a second signal indicative of a time period of the low-portion of the clock signal.

12. The duty cycle correction circuit of claim 10 wherein the measuring circuit comprises:
a first delay-locked loop having a first adjustable delay line and a first phase detector operable to generate a first delay control signal for adjusting the first adjustable delay line to achieve a locked condition, the delay of the first adjustable delay line when locked representative of the time period of the high-portion of the clock signal, the first delay control signal included with the signals provided by the measuring circuit; and
a second delay-locked loop having a second adjustable delay line and a second phase detector operable to generate a second delay control signal for adjusting the second adjustable delay line to achieve a locked condition, the delay of the second adjustable delay line when locked representative of the time period of the low-portion of the clock signal, the second delay control signal included with the signals provided by the measuring circuit.

13. The duty cycle correction circuit of claim 10 wherein the decode logic comprises:
logic circuitry operable to generate active delay adjustment signals indicative of increasing and decreasing time differences between the high- and low-portions of the clock signal and further operable to generate inactive delay adjustment signals indicative of maintaining the time difference between the high- and low-portions of the clock signal.

14. The duty cycle correction circuit of claim 10 wherein the logic circuitry comprises:
first logic circuitry operable to alternatively generate first and second tracking signals in response to adjustment signals indicative of an increasing time difference and adjustment signals indicative of a decreasing difference, respectively; and
second logic circuitry operable to generate a control signal for increasing the phase relationship of the clock signal and the complementary clock signal in response to an occurrence of an adjustment signal indicative of an increasing time difference while a first tracking signal is generated by the first logic circuitry and further operable to generate a control signal for decreasing the phase relationship of the clock signal and the complementary clock signal in response to an occurrence of an active adjustment signal indicative of a decreasing time difference while a second active tracking signal is generated by the first logic circuitry.

* * * * *